(12) United States Patent
Park et al.

(10) Patent No.: US 11,152,044 B1
(45) Date of Patent: Oct. 19, 2021

(54) SYSTEM FOR PERFORMING PHASE MATCHING OPERATION

(71) Applicant: SK hynix Inc., Icheon-si (KR)

(72) Inventors: Min Su Park, Seoul (KR); Min Gyu Park, Icheon-si (KR); Geun Ho Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/932,077

(22) Filed: Jul. 17, 2020

(30) Foreign Application Priority Data

Apr. 17, 2020 (KR) .................... 10-2020-0047012

(51) Int. Cl.
| | | |
|---|---|---|
| *G11C 7/00* | (2006.01) | |
| *G11C 7/22* | (2006.01) | |
| *G11C 8/18* | (2006.01) | |
| *G11C 7/10* | (2006.01) | |
| *H03L 7/081* | (2006.01) | |

(52) U.S. Cl.
CPC ............ *G11C 7/222* (2013.01); *G11C 7/1066* (2013.01); *G11C 7/1093* (2013.01); *G11C 8/18* (2013.01); *H03L 7/081* (2013.01)

(58) Field of Classification Search
CPC ........... G11C 7/222; G11C 7/227; G11C 7/18; G11C 7/1066; G11C 7/1093
See application file for complete search history.

(56) References Cited

U.S. PATENT DOCUMENTS

| | | | |
|---|---|---|---|
| 6,711,090 B2 | 3/2004 | Fujimori | |
| 2007/0047340 A1* | 3/2007 | Kim .................... | G11C 7/222 365/194 |
| 2009/0296501 A1* | 12/2009 | Searles ............... | G06F 13/1689 365/193 |
| 2010/0090737 A1* | 4/2010 | Watanabe ........ | G01R 31/31727 327/161 |
| 2011/0047319 A1* | 2/2011 | Jeon .................... | G06F 13/4243 711/103 |
| 2014/0055183 A1* | 2/2014 | Jung .................... | H03L 7/0816 327/158 |
| 2019/0235760 A1* | 8/2019 | Howe .................... | G06F 3/0611 |
| 2020/0219548 A1* | 7/2020 | Jeong .................... | G11C 7/1066 |

FOREIGN PATENT DOCUMENTS

KR 100703976 B1 4/2007

* cited by examiner

*Primary Examiner* — Toan K Le (74) *Attorney, Agent, or Firm* — William Park & Associates Ltd.

(57) ABSTRACT

A system for performing a phase matching operation includes a controller configured to output a clock, a command, and a strobe signal, and to input/output data. The system also includes a semiconductor device configured to generate an internal strobe signal by matching the phases of the command and the strobe signal according to the clock, and to input/output the data in synchronization with the internal strobe signal, wherein the semiconductor device generates the internal strobe signal from the strobe signal by compensating for a delay amount of a first path to which the command is inputted and a delay amount of a second path to which the strobe signal is inputted.

20 Claims, 11 Drawing Sheets

SYSTEM FOR PERFORMING PHASE MATCHING OPERATION

CROSS-REFERENCES TO RELATED APPLICATIONS

The present application claims priority under 35 U.S.C. § 119(a) to Korean application number 10-2020-0047012, filed on Apr. 17, 2020, which is incorporated by reference in its entirety.

BACKGROUND OF THE DISCLOSURE

Embodiments of the present disclosure relate to a system for matching the phases of a strobe signal and a command synchronized with a clock, by compensating for delay amounts of paths to which the command and strobe signal are inputted.

Recently, with the increase in operating speed of semiconductor systems, a high transfer rate is required between semiconductor devices included in the semiconductor systems. In order to satisfy a high transfer rate or high bandwidth for data which are inputted/outputted in series between semiconductor devices, new techniques are applied. For example, a clock dividing technique is used to input/output data at high speed. When a clock is divided, multi-phase clocks having different phases are generated. The multi-phase clocks are used to deserialize or serialize data, in order to input/output data at high speed.

SUMMARY OF THE DISCLOSURE

Various embodiments are directed to a system for performing a phase matching operation of matching phases of a strobe signal and a command synchronized with a clock by compensating for a delay amount as much as a path to which the command synchronized with the clock is inputted and a path to which the strobe signal is inputted, using a DLL (Delay-Locked Loop) clock.

Also, various embodiments are directed to a system for performing a phase matching operation, which performs a data input/output operation by matching the phases of a strobe signal and a command synchronized with a clock.

In an embodiment, a system for performing a phase matching operation may include a controller configured to output a clock, a command, and a strobe signal, and to input/output data. The system may also include a semiconductor device configured to generate an internal strobe signal by matching the phases of the command and the strobe signal according to the clock, and to input/output the data in synchronization with the internal strobe signal, wherein the semiconductor device generates the internal strobe signal from the strobe signal by compensating for a delay amount of a first path to which the command is inputted and a delay amount of a second path to which the strobe signal is inputted.

In an embodiment, a system for performing a phase matching operation may include a DLL circuit configured to generate a DLL clock by controlling the phase of a clock. The system may also include an input/output control circuit configured to generate a first internal strobe signal, a second internal strobe signal, a third internal strobe signal, and a fourth internal strobe signal by matching phases of a command and a strobe signal according to the DLL clock, wherein the input/output control circuit generates the first to fourth internal strobe signals from the strobe signal by compensating for a delay amount of a first path to which the command is inputted and a delay amount of a second path to which the strobe signal is inputted.

In accordance with the present embodiment, it is possible to match the phases of the strobe signal and the command synchronized with the clock, by compensating for the delay amount as much as the first path to which the command synchronized with the clock is inputted and the second path to which the strobe signal is inputted, using the DLL clock.

Furthermore, it is possible to prevent an error of a data input/output operation because the data input/output operation is performed by matching the phases of the strobe signal and the command synchronized with the clock.

DESCRIPTION OF SPECIFIC EMBODIMENTS

The term "preset" indicates that the value of a parameter is previously decided, when the parameter is used in a process or algorithm. According to different embodiments, the value of the parameter may be set before or when the process or algorithm is started or be set while the process or algorithm is being performed.

The terms such as "first" and "second," which are used to distinguish among various components, are not limited by the components. For example, a first component may be referred to as a second component, and vice versa. Terms such as "first" and "second" are not meant to indicate a particular number or sequence of components, unless otherwise stated.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having "logic high level" is distinguished from a signal having "logic low level." For example, when a signal having a first voltage corresponds to "logic high level," a signal having a second voltage may correspond to "logic low level." According to an embodiment, "logic high level" may be set to a voltage higher than "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the present disclosure will be described in more detail through embodiments. The embodiments are only used to exemplify the present disclosure, and the scope of the present disclosure is not limited by the embodiments.

Figure 1:
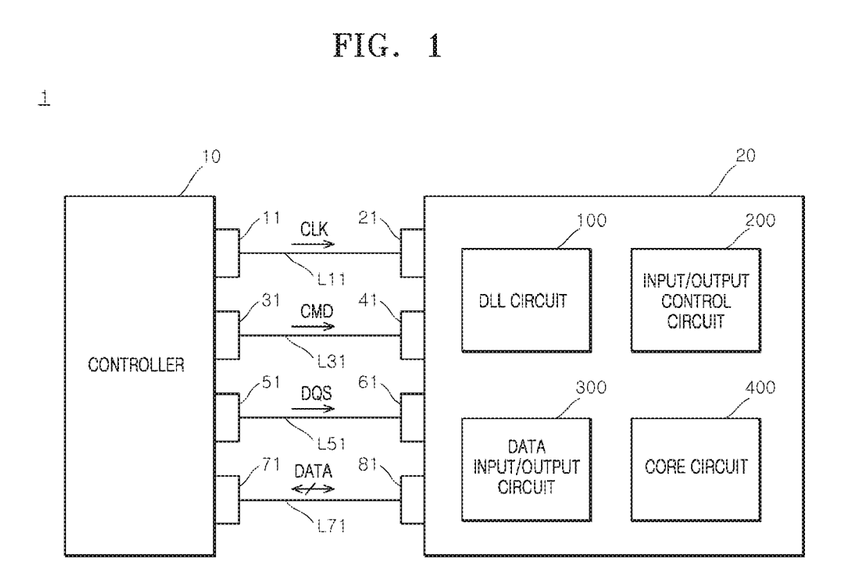
FIG. 1 is a block diagram illustrating a configuration of a system for performing a phase matching operation in accordance with an embodiment.

As illustrated in FIG. 1, a system 1 for performing a phase matching operation in accordance with an embodiment may include a controller 10 and a semiconductor device 20. The semiconductor device 20 may include a DLL (Delay-Locked Loop) circuit 100, an input/output control circuit 200, a data input/output circuit 300, and a core circuit 400.

The controller 10 may include a first control pin 11, a second control pin 31, a third control pin 51, and a fourth control pin 71. The semiconductor device 20 may include a first semiconductor pin 21, a second semiconductor pin 41, a third semiconductor pin 61, and a fourth semiconductor pin 81. A first transmission line L11 may be coupled between the first control pin 11 and the first semiconductor pin 21. A second transmission line L31 may be coupled between the second control pin 31 and the second semiconductor pin 41. A third transmission line L51 may be coupled between the third control pin 51 and the third semiconductor pin 61. A fourth transmission line L71 may be coupled between the fourth control pin 71 and the fourth semiconductor pin 81. The controller 10 may transmit a clock CLK to the semiconductor device 20 through the first transmission line L11 in order to control the semiconductor device 20. The controller 10 may transmit a command CMD to the semiconductor device 20 through the second transmission line L31 in order to control the semiconductor device 20. The controller 10 may transmit a strobe signal DQS to the semiconductor device 20 through the third transmission line L51 in order to control the semiconductor device 20. The controller 10 and the semiconductor device 20 may transmit and receive data DATA through the fourth transmission line L71.

The controller 10 may output, to the semiconductor device 20, the clock CLK, the command CMD, the strobe signal DQS, and the data DATA for performing a write operation. The controller 10 may control the semiconductor device 20 to perform a phase matching operation for compensating for a phase difference between the strobe signal DQS and the command CMD synchronized with the clock CLK, during a write operation. According to an embodiment, the controller 10 in accordance with the present embodiment may be implemented to output, to the semiconductor device 20, the clock CLK, the command CMD, and the strobe signal DQS for performing a read operation, and receive the data DATA from the semiconductor device 20. The command CMD may be sequentially outputted in synchronization with odd pulses or even pulses included in the clock CLK. The strobe signal DQS may be set to a signal which toggles for a data input/output operation, regardless of the clock CLK.

The DLL circuit 100 may generate a DLL clock (DLL_CLK of FIG. 2) by controlling the phase of the clock CLK. The DLL circuit 100 may generate the DLL clock (DLL_CLK of FIG. 2) by controlling the phase of the clock CLK such that the phase of the clock CLK is suitable for an internal operation of the semiconductor device 20.

Figure 2:
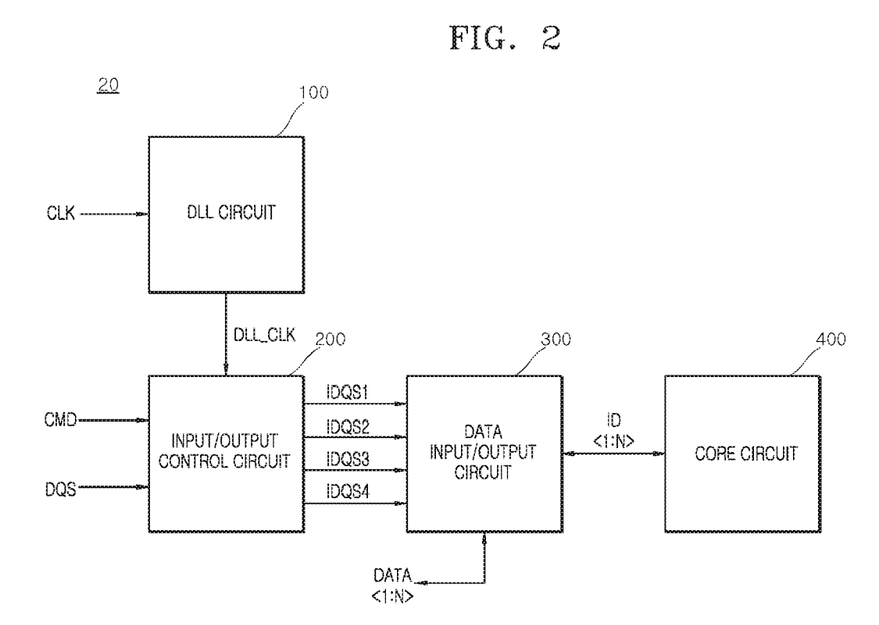
FIG. 2 is a block diagram illustrating a configuration of a semiconductor device included in the system for performing a phase matching operation, which is illustrated in FIG. 1.

The input/output control circuit 200 may generate a first internal strobe signal (IDQS1 of FIG. 2), a second internal strobe signal (IDQS2 of FIG. 2), a third internal strobe signal (IDQS3 of FIG. 2) and a fourth internal strobe signal (IDQS4 of FIG. 2) from the strobe signal DQS, according to the DLL clock (DLL_CLK of FIG. 2).

The data input/output circuit 300 may generate internal data (ID<1:N> of FIG. 2) from the data DATA in synchronization with the first internal strobe signal (IDQS1 of FIG. 2), the second internal strobe signal (IDQS2 of FIG. 2), the third internal strobe signal (IDQS3 of FIG. 2), and the fourth internal strobe signal (IDQS4 of FIG. 2) during a write operation. The data input/output circuit 300 may generate the data DATA from the internal data (ID<1:N> of FIG. 2) in synchronization with the first internal strobe signal (IDQS1 of FIG. 2), the second internal strobe signal (IDQS2 of FIG. 2), the third internal strobe signal (IDQS3 of FIG. 2), and the fourth internal strobe signal (IDQS4 of FIG. 2) during a read operation.

The core circuit 400 may store the internal data (ID<1:N> of FIG. 2) during the write operation. The core circuit 400 may output the internal data (ID<1:N> of FIG. 2) stored therein during the read operation.

FIG. 2 is a block diagram illustrating a configuration of the semiconductor device 20 in accordance with an embodiment. As illustrated in FIG. 2, the semiconductor device 20 may include the DLL circuit 100, the input/output control circuit 200, the data input/output circuit 300, and the core circuit 400.

The DLL circuit 100 may generate the DLL clock DLL_CLK by controlling the phase of the clock CLK. The DLL circuit 100 may generate the DLL clock DLL_CLK by controlling the phase of the clock CLK such that the phase of the clock CLK is suitable for an internal operation of the semiconductor device 20. The DLL circuit 100 may control a delay amount for adjusting the position of an edge of the clock CLK such that the phase of the clock CLK is suitable for the internal operation of the semiconductor device 20. The DLL circuit 100 may generate the DLL clock DLL_CLK by delaying the clock CLK by the controlled delay amount. The DLL circuit 100 may be implemented as a general DLL circuit for controlling the phase of the clock CLK.

The input/output control circuit 200 may generate the first to fourth internal strobe signals IDQS1 to IDQS4 by dividing the frequency of the strobe signal DQS. The input/output control circuit 200 may generate the first to fourth internal strobe signals IDQS1 to IDQS4 from the strobe signal DQS according to the DLL clock DLL_CLK. The input/output control circuit 200 may generate the first to fourth internal strobe signals IDQS1 to IDQS4 from the strobe signal DQS by compensating for a delay amount of a first path to which the command CMD is inputted and a delay amount of a second path to which the strobe signal DQS is inputted, according to the DLL clock DLL_CLK. The first path and the second path will be described in detail with reference to the drawings which will be described.

The data input/output circuit 300 may generate internal data ID<1:N> from data DATA<1:N> in synchronization with the first to fourth internal strobe signals IDQS1 to IDQS4 during a write operation. The data input/output circuit 300 may generate the data DATA<1:N> from the internal data ID<1:N> in synchronization with the first to fourth internal strobe signals IDQS1 to IDQS4 during a read operation. According to an embodiment, the number N of bits contained in each of the data DATA<1:N> and the internal data ID<1:N> may be set to various values.

The core circuit 400 may store the internal data ID<1:N> during the write operation. The core circuit 400 may output the internal data ID<1:N> stored therein during the read operation.

Figure 3:
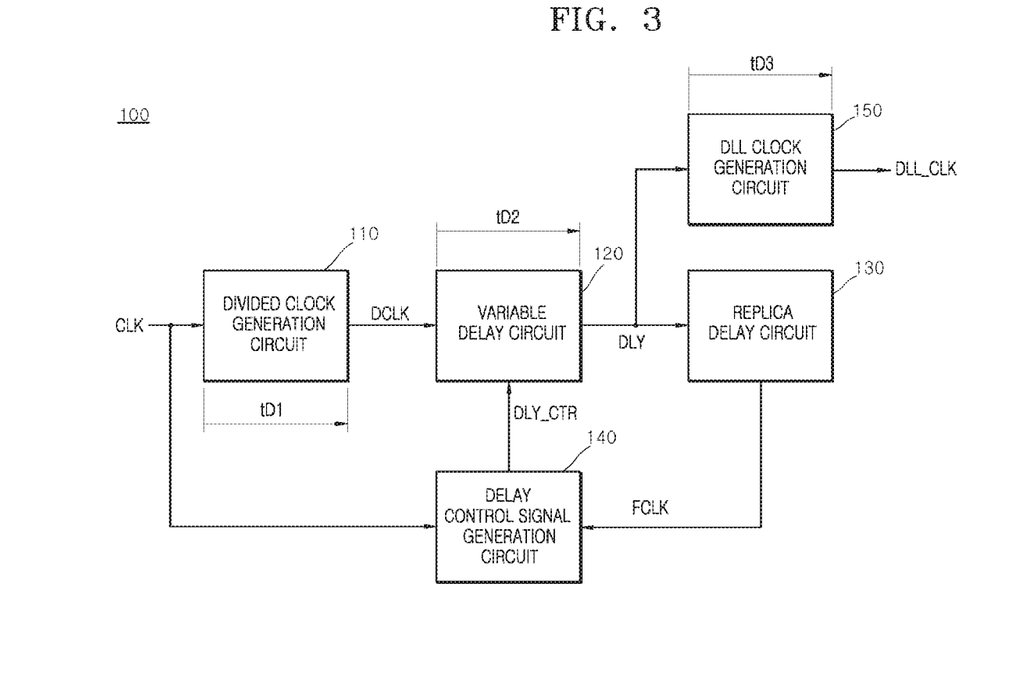
FIG. 3 is a block diagram illustrating a configuration of a DLL (Delay-Locked Loop) circuit included in the semiconductor device illustrated in FIG. 2.

FIG. 3 is a block diagram illustrating a configuration of the DLL circuit 100 in accordance with an embodiment. As illustrated in FIG. 3, the DLL circuit 100 may include a divided clock generation circuit 110, a variable delay circuit 120, a replica delay circuit 130, a delay control signal generation circuit 140, and a DLL clock generation circuit 150.

The divided clock generation circuit 110 may generate a divided clock DCLK by dividing the frequency of the clock CLK. The divided clock generation circuit 110 may generate the divided clock DCLK having a frequency corresponding to ½ of the frequency of the clock CLK. The divided clock generation circuit 110 may be set to have a first delay time tD1. The first delay time tD1 may be set to an internal delay time of the divided clock generation circuit 110.

The variable delay circuit 120 may generate a delay signal DLY by delaying the divided clock DCLK. The variable delay circuit 120 may generate the delay signal DLY by delaying the divided clock DCLK by a delay amount controlled through a delay control signal DLY_CTR. When the delay control signal DLY_CTR is disabled, the variable delay circuit 120 may generate the delay signal DLY by delaying the divided clock DCLK by a fixed delay amount. When the delay control signal DLY_CTR is enabled, the variable delay circuit 120 may generate the delay signal DLY by delaying the divided clock DCLK by a delay amount which is controlled while increased or decreased. According to an embodiment, the delay amount of the variable delay circuit 120 may be set to various values. The variable delay circuit 120 may be set to have a second delay time tD2. The second delay time tD2 may be set to an internal delay time of the variable delay circuit 120.

The replica delay circuit 130 may generate a feedback clock FCLK by delaying the delay signal DLY by a preset delay amount. The replica delay circuit 130 may generate the feedback clock FCLK by delaying the delay signal DLY such that the delay signal DLY is suitable for an internal operation of the semiconductor device 20. The replica delay circuit 130 may be implemented as a general replica delay circuit having a delay amount which is set to the same amount as the internal operation of the semiconductor device 20. According to an embodiment, the delay amount of the replica delay circuit 130 may be set to various values.

The delay control signal generation circuit 140 may generate the delay control signal DLY_CTR by detecting the phase of the feedback dock FCLK. The delay control signal generation circuit 140 may generate the delay control signal DLY_CTR by comparing the phases of the feedback clock FCLK and the clock CLK. The delay control signal generation circuit 140 may generate the delay control signal DLY_CTR which is disabled when the feedback clock FCLK and the clock CLK are in phase. The delay control signal generation circuit 140 may generate the delay control signal DLY_CTR which is enabled when the feedback clock FCLK and the clock CLK are out of phase. The delay control signal generation circuit 140 may generate the delay control signal DLY_CTR which is disabled when the feedback clock FCLK is generated to have a phase suitable for an internal operation of the semiconductor device 20. The delay control signal generation circuit 140 may generate the delay control signal DLY_CTR which is enabled when the phase of the feedback clock FCLK is not suitable for the internal operation of the semiconductor device 20.

The DLL clock generation circuit 150 may output the delay signal DLY as the DLL clock DLL_CLK. The DLL clock generation circuit 150 may generate the DLL clock DLL_CLK by delaying the delay signal DLY. The DLL clock generation circuit 150 may be set to have a third delay time tD3. The third delay time tD3 may be set to an internal delay time of the DLL clock generation circuit 150.

Figure 4:
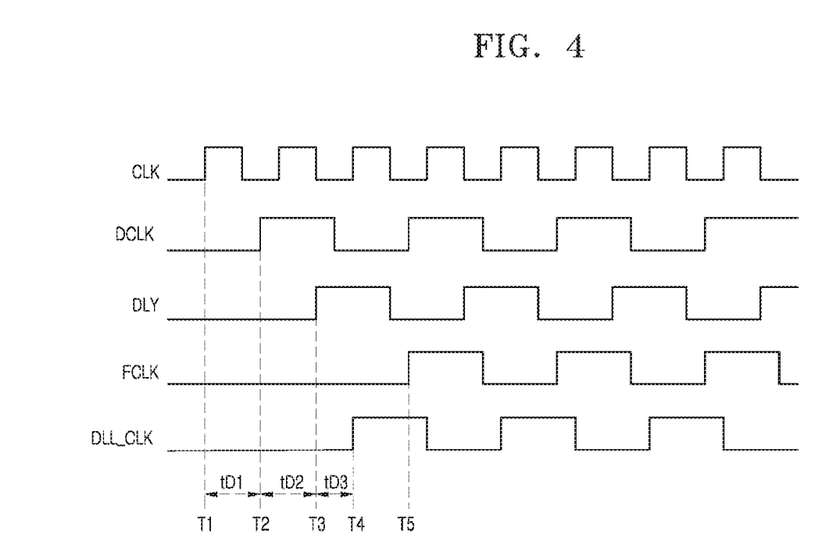
FIG. 4 is a timing diagram for describing an operation of the DLL circuit illustrated in FIG. 3.

Referring to FIG. 4, the operation of the DLL circuit 100 in accordance with the present embodiment will be described as follows.

At a time point T2, the divided clock generation circuit 110 generates the divided clock DCLK from the clock CLK which toggles at a time point T1. The divided clock generation circuit 110 generates the divided clock DCLK by dividing the frequency of the clock CLK. The divided clock DCLK is generated to have a frequency corresponding to ½ of the frequency of the clock CLK. The divided clock generation circuit 110 generates the divided clock DCLK including a pulse which is generated at the time point T2 when the first delay time tD1 elapses from the time point T1.

At a time point T3, the variable delay circuit 120 generates the delay signal DLY by delaying the divided clock DCLK of the time point T2. The variable delay circuit 120 generates the delay signal DLY including a pulse, which is generated at the time point T3 when the second delay time tD2 elapses from the time point T2, by delaying the divided clock DCLK by the delay amount controlled by the delay control signal DLY_CTR.

At a time point T4, the DLL clock generation circuit 150 generates the DLL clock DLL_CLK by delaying the delay signal DLY of the time point T3, The DLL clock generation circuit 150 generates the DLL clock DLL_CLK including a pulse which is generated at the time point T4 when the third delay time tD3 elapses from the time point T3.

At a time point T5, the replica delay circuit 130 generates the feedback clock FCLK by delaying the delay signal DLY by a preset delay amount. The replica delay circuit 130 generates the feedback clock FCLK by delaying the delay signal DLY of the time point T3 by the preset delay amount.

The delay control signal generation circuit 140 generates the delay control signal DLY_CTR which is disabled when the feedback clock FCLK is generated to have a phase suitable for the internal operation of the semiconductor device 20. The delay control signal generation circuit 140 generates the delay control signal DLY_CTR which is enabled when the phase of the feedback clock FCLK is not suitable for the internal operation of the semiconductor device 20.

The DLL circuit 100 in accordance with the present embodiment may generate the DLL clock DLL_CLK by controlling the phase of the clock CLK such that the phase of the clock CLK is suitable for the internal operation of the semiconductor device 20. The DLL circuit 100 may generate the DLL clock DLL_CLK by dividing the frequency of the clock CLK. The DLL circuit 100 may generate the DLL clock DLL_CLK having a frequency corresponding to ½ of the frequency of the clock CLK.

Figure 5:
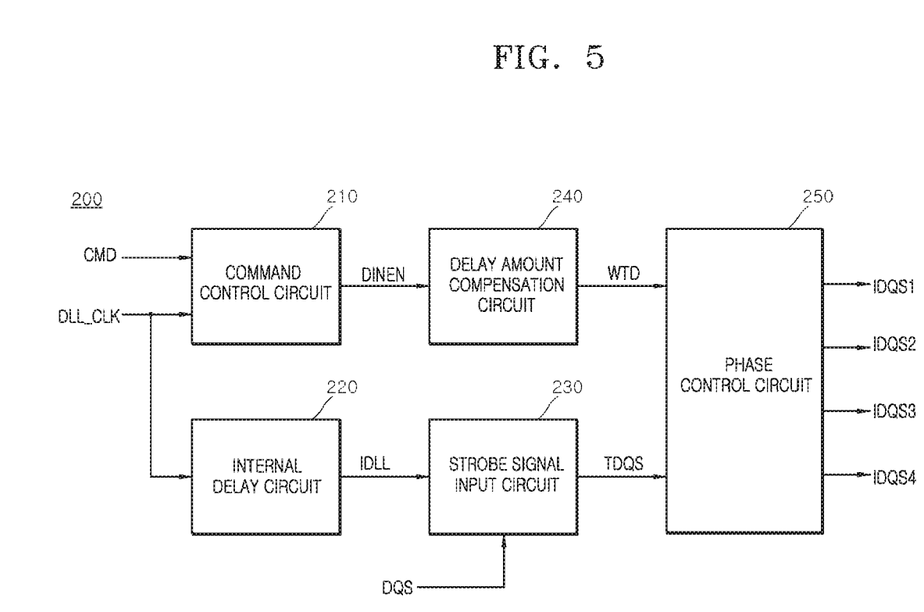
FIG. 5 is a block diagram illustrating a configuration of an input/output control circuit included in the semiconductor device illustrated in FIG. 2.

FIG. 5 is a block diagram illustrating a configuration of the input/output control circuit 200 in accordance with an embodiment. As illustrated in FIG. 5, the input/output control circuit 200 may include a command control circuit 210, an internal delay circuit 220, a strobe signal input circuit 230, a delay amount compensation circuit 240, and a phase control circuit 250.

The command control circuit 210 may generate a data input control signal DINEN by delaying the command CMD in synchronization with the DLL clock DLL_CLK. The command control circuit 210 may generate the data input control signal DINEN by delaying the command CMD by a first delay amount in synchronization with the DLL clock DLL_CLK. The first delay amount may be set to the delay amount of the first path to which the command CMD is inputted. The first path may be set to the command control circuit 210 to which the command CMD is inputted.

The internal delay circuit 220 may generate an input delay clock IDLL by delaying the DLL clock DLL_CLK. According to an embodiment, the delay amount of the internal delay circuit 220 may be set to various values.

The strobe signal input circuit 230 may receive the strobe signal DQS in synchronization with the input delay clock IDLL, and generate a transfer strobe signal TDQS. The strobe signal input circuit 230 may generate the transfer strobe signal TDQS by delaying the strobe signal DQS by a second delay amount in synchronization with the input delay clock IDLL. The second delay amount may be set to the delay amount of the second path to which the strobe signal DQS is inputted. The second path may be set to the strobe signal input circuit 230 to which the strobe signal DQS is inputted.

The delay amount compensation circuit 240 may generate a write delay signal WTD by delaying the data input control signal DINEN by a third delay amount. The third delay amount may be set to a larger delay amount than the second delay amount.

The phase control circuit 250 may generate the first to fourth internal strobe signals IDQS1 to IDQS4 by controlling the phase of the transfer strobe signal TDQS in synchronization with the write delay signal WTD. The phase control circuit 250 may generate the first to fourth internal strobe signals IDQS1 to IDQS4 by shifting the transfer strobe signal TDQS in synchronization with the write delay signal WTD. The first to fourth internal strobe signals IDQS1 to IDQS4 have a phase difference of 90° set therebetween. The phase difference of 90° may be set to ¼ period of the transfer strobe signal TDQS.

Figure 6:
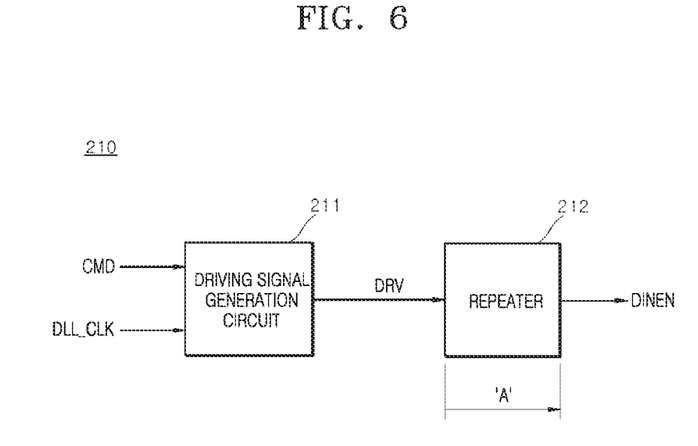
FIG. 6 is a block diagram illustrating a configuration of a command control circuit included in the input/output control circuit illustrated in FIG. 5.

FIG. 6 is a block diagram illustrating a configuration of the command control circuit 210 in accordance with an embodiment. As illustrated in FIG. 6, the command control circuit 210 may include a driving signal generation circuit 211 and a repeater 212.

The driving signal generation circuit 211 may generate a driving signal DRV from the command CMD in synchronization with the DLL clock DLL_CLK. The driving signal generation circuit 211 may latch the command CMD in synchronization with an edge of the DLL clock DLL_CLK. The driving signal generation circuit 211 may output, as the driving signal DRV, the command CMD latched in synchronization with the edge of the DLL clock DLL_CLK.

The repeater 212 may generate the data input control signal DINEN by buffering the driving signal DRV. The repeater 212 may generate the data input control signal DINEN by delaying the driving signal DRV by a first delay amount A. The first delay amount A will be described in detail with reference to FIG. 9 which will be described below.

Figure 7:
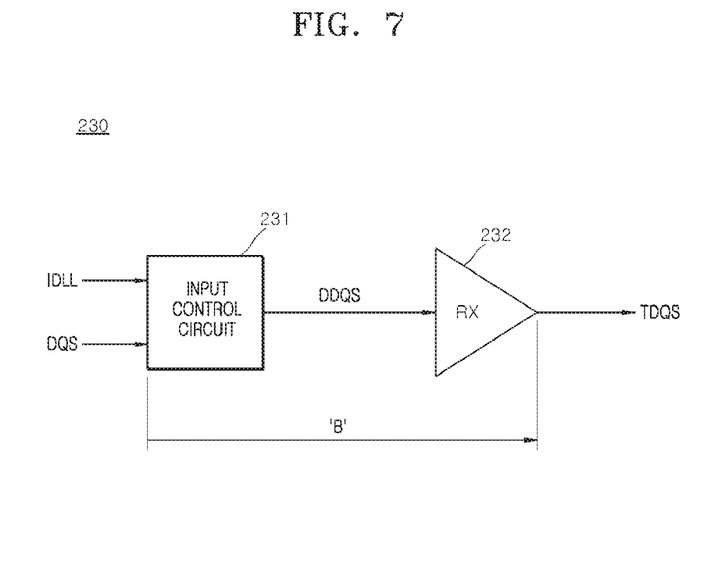
FIG. 7 is a block diagram illustrating a configuration of a strobe signal input circuit included in the input/output control circuit illustrated in FIG. 5.

FIG. 7 is a block diagram illustrating a configuration of the strobe signal input circuit 230 in accordance with an embodiment. As illustrated in FIG. 7, the strobe signal input circuit 230 may include an input control circuit 231 and a receiver 232.

The input control circuit 231 may generate an input strobe signal DDQS by delaying the strobe signal DQS in synchronization with the input delay clock IDLL. The input control circuit 231 may receive the strobe signal DQS in synchronization with an edge of the input delay clock IDLL. The input control circuit 231 may output, as the input strobe signal DDQS, the strobe signal DQS received in synchronization with the edge of the input delay clock IDLL.

The receiver 232 may generate the transfer strobe signal TDQS by buffering the input strobe signal DDQS. The receiver 232 may generate the transfer strobe signal TDQS by delaying the input strobe signal DDQS.

The delay amount of the input control circuit 231 and the receiver 232 may be set to a second delay amount B. The second delay amount B will be described in detail with reference to FIG. 9 which will be described below.

Figure 8:
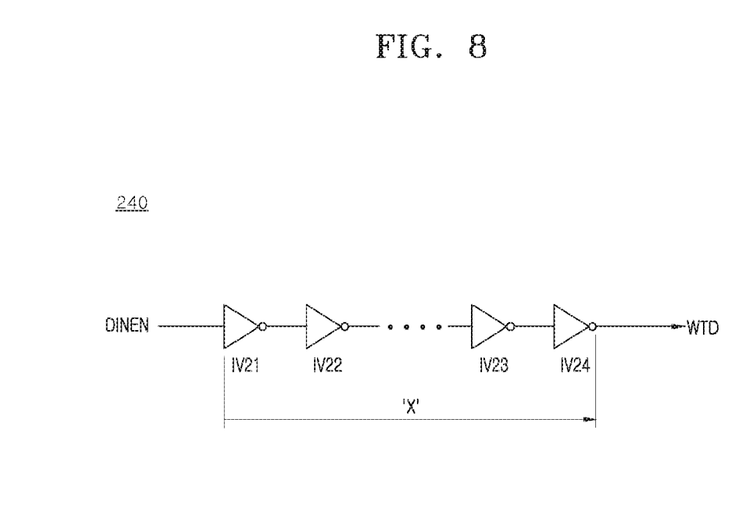
FIG. 8 is a circuit diagram illustrating a configuration of a delay amount compensation circuit included in the input/output control circuit illustrated in FIG. 5.

FIG. 8 is a circuit diagram illustrating a configuration of the delay amount compensation circuit 240 in accordance with an embodiment. As illustrated in FIG. 8, the delay amount compensation circuit 240 may be implemented as an inverter chain in which a plurality of inverters IV21 to IV24 are coupled in series.

The delay amount compensation circuit 240 may generate the write delay signal WTD by delaying the data input control signal DIN EN by a third delay amount X. The third delay amount X may be set to a delay amount larger than the second delay amount B. The number of inverters for setting the third delay amount X may be set to various values according to an embodiment.

Figure 9:
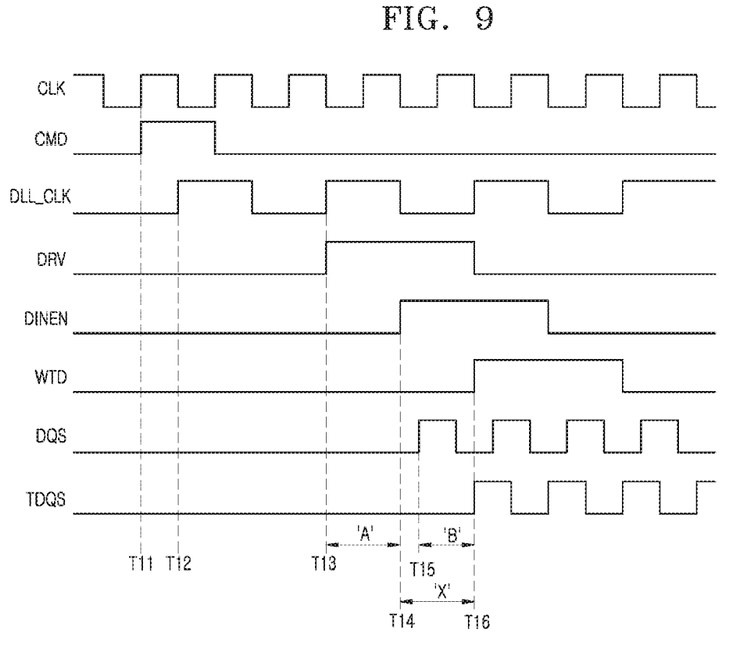
FIG. 9 is a timing diagram for describing a phase matching operation of the system for performing a phase matching operation in accordance with the embodiment.

Referring to FIG. 9, the phase matching operation of the system in accordance with the present embodiment will be described as follows.

At a time point T11, the controller 10 may output, to the semiconductor device 20, the clock CLK, the command CMD and the data DATA<1:N> for performing a write operation.

At a time point T12, the DLL circuit 100 generates the DLL clock DLL_CLK by dividing the frequency of the clock CLK inputted at the time point T11. The DLL circuit 100 generates the DLL clock DLL_CLK having a frequency corresponding to ½ of the frequency of the clock CLK.

At a time point T13, the driving signal generation circuit 211 generates the driving signal DRV from the command CMD inputted at the time point T11, in synchronization with the DLL clock DLL_CLK.

At a time point T14, the repeater 212 generates the data input control signal DINEN by delaying the driving signal DRV generated at the time point T13. The repeater 212 generates the data input control signal DINEN by buffering the driving signal DRV, generated at the time point T13, by the first delay amount A. The first delay amount A is set to a time interval from the time point T13 to the time point 114.

At a time point, the controller 10 outputs the strobe signal DQS for performing a write operation to the semiconductor device 20.

At a time point T16, the strobe signal input circuit 230 generates the transfer strobe signal TDQS by delaying the strobe signal DQS inputted at the time point 115. The strobe signal input circuit 230 generates the transfer strobe signal TDQS by delaying the strobe signal DQS, inputted at the time point T15, by the second delay amount B. The second delay amount B is set to a time interval from the time point T15 to the time point T16.

The delay amount compensation circuit 240 generates the write delay signal WTD by delaying the data input control signal DINEN generated at the time point 114. The delay amount compensation circuit 240 generates the write delay signal WTD by delaying the data input control signal DINEN, generated at the time point T14, by the third delay amount X.

The system for performing a phase matching operation in accordance with the present embodiment may match the phases of the strobe signal and the command synchronized with the clock, by compensating for the delay amount as much as the first path to which the command synchronized with the dock is inputted and the second path to which the strobe signal is inputted, using the DLL clock.

Figure 10:
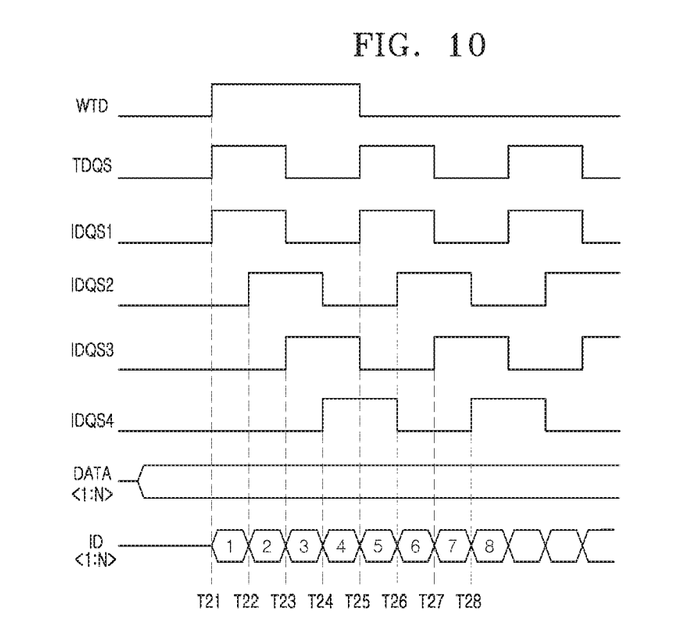
FIG. 10 is a timing diagram for describing a data input/output operation of the system for performing a phase matching operation in accordance with the embodiment.

Referring to FIG. 10, the data input/output operation of the system in accordance with the present embodiment will be described. In the following descriptions, a write operation will be taken as an example.

At a time point T21, the strobe signal input circuit 230 generates the transfer strobe signal TDQS by delaying the input strobe signal DQS.

The delay amount compensation circuit 240 generates the write delay signal WTD by delaying the data input control signal DINEN. Because the operation of generating the transfer strobe signal TDQS and the write delay signal WTD has been described with reference to FIG. 9, the detailed descriptions thereof will be omitted herein.

The phase control circuit 250 generates the first internal strobe signal IDQS1 by controlling the phase of the transfer strobe signal TDQS in synchronization with the write delay signal WTD.

The data input/output circuit 300 generates first internal data ID<1> from first data DATA<1> in synchronization with the first internal strobe signal IDQS1.

The core circuit 400 stores the first internal data ID<1>.

At a time point T22, the phase control circuit 250 generates the second internal strobe signal IDQS2 by controlling the phase of the transfer strobe signal TDQS.

The data input/output circuit 300 generates second internal data ID<2> from second data DATA<2> in synchronization with the second internal strobe signal IDQS2.

The core circuit 400 stores the second internal data ID<2>.

At a time point T23, the phase control circuit 250 generates the third internal strobe signal IDQS3 by controlling the phase of the transfer strobe signal TDQS.

The data input/output circuit 300 generates third internal data ID<3> from third data DATA<3> in synchronization with the third internal strobe signal IDQS3.

The core circuit 400 stores the third internal data ID<3>.

At a time point T24, the phase control circuit 250 generates the fourth internal strobe signal IDQS4 by controlling the phase of the transfer strobe signal TDQS.

The data input/output circuit 300 generates fourth internal data ID<4> from fourth data DATA<4> in synchronization with the fourth internal strobe signal IDQS4.

The core circuit 400 stores the fourth internal data ID<4>.

At a time point T25, the phase control circuit 250 generates the first internal strobe signal IDQS1 by controlling the phase of the transfer strobe signal TDQS.

The data input/output circuit 300 generates fifth internal data ID<5> from fifth data DATA<5> in synchronization with the first internal strobe signal IDQS1.

The core circuit 400 stores the fifth internal data ID<5>.

At a time point T26, the phase control circuit 250 generates the second internal strobe signal IDQS2 by controlling the phase of the transfer strobe signal TDQS.

The data input/output circuit 300 generates sixth internal data ID<6> from sixth data DATA<6> in synchronization with the second internal strobe signal IDQS2.

The core circuit 400 stores the sixth internal data ID<6>.

At a time point T27, the phase control circuit 250 generates the third internal strobe signal IDQS3 by controlling the phase of the transfer strobe signal TDQS.

The data input/output circuit 300 generates seventh internal data ID<7> from seventh data DATA<7> in synchronization with the third internal strobe signal IDQS3.

The core circuit 400 stores the seventh internal data ID<7>.

At a time point T28, the phase control circuit 250 generates the fourth internal strobe signal IDQS4 by controlling the phase of the transfer strobe signal TDQS.

The data input/output circuit 300 generates eighth internal data ID<8> from eighth data DATA<8> in synchronization with the fourth internal strobe signal IDQS4.

The core circuit 400 stores the eighth internal data ID<8>.

The core circuit 400 is implemented to sequentially store the first to eighth internal data ID<1:8> from the time point T21 to the time point T28. However, the core circuit 400 may be implemented to store the first to eighth internal data ID<1:8> at a time after the first to eighth internal data ID<1:8> are all generated.

Then, the write operation is performed in the same manner as the above-described operation. Thus, the detailed descriptions thereof are omitted herein.

The system for performing a phase matching operation in accordance with the present embodiment may perform the data input/output operation by matching the phases of the strobe signal and the command synchronized with the clock, thereby preventing an error of the data input/output operation.

Figure 11:
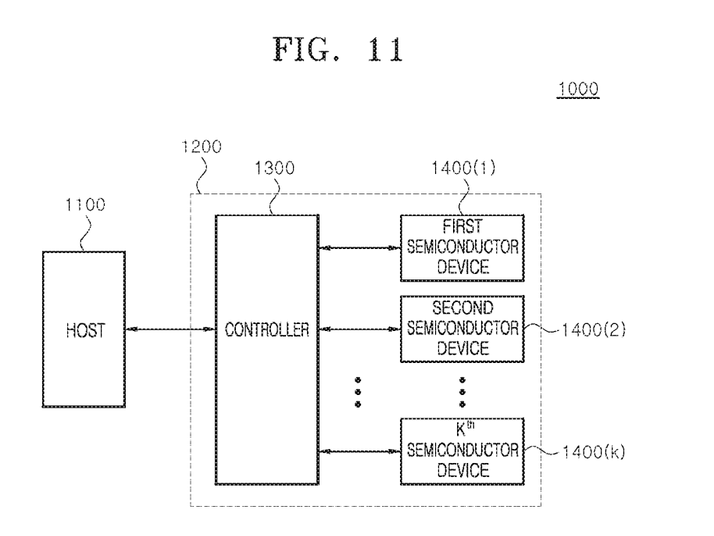
FIG. 11 is a diagram illustrating a configuration of an electronic system in accordance with an embodiment, to which the system for performing a phase matching operation, illustrated in FIGS. 1 to 10, is applied.

FIG. 11 is a block diagram illustrating a configuration of an electronic system 1000 in accordance with an embodiment. As illustrated in FIG. 11, the electronic system 1000 may include a host 1100 and a semiconductor system 1200.

The host 1100 and the semiconductor system 1200 may transmit/receive signals to/from each other using an interface protocol. Examples of the interface protocol used between the host 1100 and the semiconductor system 1200 may include an MMC (Multi-Media Card), ESDI (Enhanced Small Disk Interface), IDE (Integrated Drive Electronics), PCI-E (Peripheral Component Interconnect-Express), ATA (Advanced Technology Attachment), SATA (Serial ATA), PATA (Parallel ATA), SAS (Serial Attached SCSI), USB (Universal Serial Bus), and the like.

The semiconductor system 1200 may include a controller 1300 and semiconductor devices 1400(K:1). The controller 1300 may control the semiconductor devices 1400(K:1) to perform a phase matching operation during a write operation. The controller 1300 may control the semiconductor devices 1400(K:1) to perform a data input/output operation during the write operation. Each of the semiconductor devices 1400(K:1) may match the phases of the strobe signal and the command synchronized with the clock, by compensating for the delay amount as much as the first path to which the command synchronized with the clock is inputted and the second path to which the strobe signal is inputted, using the DLL clock during the write operation. Furthermore, each of the semiconductor devices 1400(K:1) may perform the data input/output operation by matching the phases of the strobe signal and the command synchronized with the clock, thereby preventing an error of the data input/output operation.

The controller 1300 may be implemented as the controller 10 illustrated in FIG. 1. Each of the semiconductor devices 1400(K:1) may be implemented as the semiconductor device 20 illustrated in FIG. 1. According to an embodiment, the semiconductor device 20 may be implemented as one of a DRAM (dynamic random access memory), PRAM (Phase change Random Access Memory), RRAM (Resistive Random Access Memory), MRAM (Magnetic Random Access Memory), and FRAM (Ferroelectric Random Access Memory).

A limited number of possible embodiments of the disclosure have been disclosed for illustrative purposes. Those skilled in the art will appreciate that various modifications, additions, and/or substitutions are possible, without departing from the scope and spirit of the disclosure as defined in the accompanying claims,

What is claimed is:

1. A system for performing a phase matching operation, the system comprising:
   a controller configured to output a clock, a command, and a strobe signal, and to input/output data; and
   a semiconductor device configured to generate an internal strobe signal by matching the phases of the command and the strobe signal according to the clock, and to input/output the data in synchronization with the internal strobe signal, wherein the semiconductor device generates the internal strobe signal from the strobe signal by compensating for a delay amount of a first path to which the command is inputted and a delay amount of a second path to which the strobe signal is inputted.

2. The system of claim 1, wherein the semiconductor device is configured to generate the internal strobe signal by dividing the frequency of the strobe signal.

3. The system of claim 1, wherein the semiconductor device comprises:
   a DLL circuit configured to generate a DLL (Delay-Locked Loop) clock by controlling the phase of the clock;
   an input/output control circuit configured to generate the internal strobe signal from the strobe signal by compensating for the delay amounts of the first and second paths according to the DLL clock;
   a data input/output circuit configured to generate internal data from the data in synchronization with the internal strobe signal during a write operation, or to generate the data from the internal data in synchronization with the internal strobe signal during a read operation; and
   a core circuit configured to store the internal data during the write operation, and to output the internal data stored in the core circuit during the read operation.

4. The system of claim 3, wherein the DLL circuit comprises:
   a divided clock generation circuit configured to generate a divided clock by dividing a frequency of the clock;
   a variable delay circuit configured to generate a delay signal by delaying the divided clock by a delay amount controlled through a delay control signal;
   a replica delay circuit configured to generate a feedback clock by delaying the delay signal by a preset delay amount;
   a delay control signal generation circuit configured to generate the delay control signal by comparing the phases of the feedback clock and the clock; and
   a DLL clock generation circuit configured to generate the DLL dock by delaying the delay signal.

5. The system of claim 3, wherein the input/output control circuit comprises:
   a command control circuit configured to generate a data input control signal by delaying the command by a first delay amount in synchronization with the DLL clock;
   an internal delay circuit configured to generate an input delay clock by delaying the DLL clock;
   a strobe signal input circuit configured to generate a transfer strobe signal by delaying the strobe signal by a second delay amount in synchronization with the input delay clock;
   a delay amount compensation circuit configured to generate a write delay signal by delaying the data input control signal by a third delay amount; and
   a phase control circuit configured to generate the internal strobe signal by controlling the phase of the transfer strobe signal in synchronization with the write delay signal.

6. The system of claim 5, wherein the command control circuit is set to the first path, and the strobe signal input circuit is set to the second path.

7. The system of claim 5, wherein the third delay amount of the delay amount compensation circuit is set to a larger delay amount than the second delay amount.

8. The system of claim 5, wherein the command control circuit comprises:
   a driving signal generation circuit configured to generate a driving signal from the command in synchronization with the DLL clock; and
   a repeater configured to generate a data input control signal by delaying the driving signal by the first delay amount.

9. The system of claim 5, wherein the strobe signal input circuit comprises:
   an input control circuit configured to generate an input strobe signal by delaying the strobe signal in synchronization with the input delay clock; and
   a receiver configured to generate the transfer strobe signal by delaying the input strobe signal.

10. The system of claim 9, wherein the sum of delay amounts of the input control circuit and the receiver is set to the second delay amount.

11. A system for performing a phase matching operation, the system comprising:
    a DLL circuit configured to generate a DLL clock by controlling the phase of a dock; and
    an input/output control circuit configured to generate a first internal strobe signal, a second internal strobe signal, a third internal strobe signal, and a fourth internal strobe signal by matching phases of a command and a strobe signal according to the DLL clock, wherein the input/output control circuit generates the first to fourth internal strobe signals from the strobe signal by compensating for a delay amount of a first path to which the command is inputted and a delay amount of a second path to which the strobe signal is inputted.

12. The system of claim 11, wherein the input/output control circuit is configured to generate the first to fourth internal strobe signals by dividing the phase of the strobe signal.

13. The system of claim 11, wherein the first to fourth internal strobe signals have different phases from one another.

14. The system of claim 11, wherein the DLL circuit comprises:
- a divided clock generation circuit configured to generate a divided clock by dividing a frequency of the clock;
- a variable delay circuit configured to generate a delay signal by delaying the divided clock by a delay amount controlled through a delay control signal;
- a replica delay circuit configured to generate a feedback clock by delaying the delay signal by a preset delay amount;
- a delay control signal generation circuit configured to generate the delay control signal by comparing the phases of the feedback clock and the clock; and
- a DLL clock generation circuit configured to generate the DLL clock by delaying the delay signal.

15. The system of claim 11, wherein the input/output control circuit comprises:
- a command control circuit configured to generate a data input control signal by delaying the command by a first delay amount in synchronization with the DLL clock;
- an internal delay circuit configured to generate an input delay clock by delaying the DLL clock;
- a strobe signal input circuit configured to generate a transfer strobe signal by delaying the strobe signal by a second delay amount in synchronization with the input delay clock;
- a delay amount compensation circuit configured to generate a write delay signal by delaying the data input control signal by a third delay amount; and
- a phase control circuit configured to generate the internal strobe signal by controlling the phase of the transfer strobe signal in synchronization with the write delay signal.

16. The system of claim 15, wherein the command control circuit is set to the first path, and the strobe signal input circuit is set to the second path.

17. The system of claim 15, wherein the third delay amount of the delay amount compensation circuit is set to a larger delay amount than the second delay amount.

18. The system of claim 15, wherein the command control circuit comprises:
- a driving signal generation circuit configured to generate a driving signal from the command in synchronization with the DLL clock; and
- a repeater configured to generate a data input control signal by delaying the driving signal by the first delay amount.

19. The system of claim 15, wherein the strobe signal input circuit comprises:
- an input control circuit configured to generate an input strobe signal by delaying the strobe signal in synchronization with the input delay clock; and
- a receiver configured to generate the transfer strobe signal by delaying the input strobe signal.

20. The system of claim 19, wherein the sum of delay amounts of the input control circuit and the receiver is set to the second delay amount.

* * * * *